(12) United States Patent
Sochava et al.

(10) Patent No.: US 7,615,730 B2
(45) Date of Patent: Nov. 10, 2009

(54) DEVICE AND METHOD FOR MEASURING WAVELENGTH OF AN OPTICAL SIGNAL

(75) Inventors: Sergei Sochava, Sunnyvale, CA (US); John Hutchinson, Santa Barbara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/948,375

(22) Filed: Nov. 30, 2007

(65) Prior Publication Data
US 2009/0140718 A1 Jun. 4, 2009

(51) Int. Cl.
*G01J 1/44* (2006.01)
(52) U.S. Cl. .............. 250/214 R; 250/226; 250/227.11; 250/552; 257/53; 356/411
(58) Field of Classification Search .............. 250/214 R, 250/226, 227.11, 552; 257/53; 356/411
See application file for complete search history.

(56) References Cited

U.S. PATENT DOCUMENTS

| 5,270,536 | A | 12/1993 | Malhotra |
| 6,858,829 | B2 * | 2/2005 | Nishimura et al. ...... 250/214 R |
| 7,257,142 | B2 | 8/2007 | Sochava et al. |
| 2006/0140228 | A1 | 6/2006 | McDonald et al. |
| 2006/0231913 | A1 | 10/2006 | Wilsey et al. |
| 2007/0002924 | A1 | 1/2007 | Hutchinson et al. |
| 2007/0172185 | A1 | 7/2007 | Hutchinson |
| 2007/0237482 | A1 | 10/2007 | Hutchinson |

FOREIGN PATENT DOCUMENTS

| DE | 20022136 U1 | 6/2001 |
| JP | 61283837 A | 12/1986 |

OTHER PUBLICATIONS

Office Action received for GB patent Application No. 0821387.8, mailed on Apr. 1, 2009, pp. 1-10.

* cited by examiner

*Primary Examiner*—Seung C Sohn
(74) *Attorney, Agent, or Firm*—Joseph P. Curtin; Cool Patent, P.C.

(57) ABSTRACT

A wavelength meter, an associated method, and system are generally described. In one example, an apparatus includes a photodiode to receive an optical signal and to generate a photocurrent upon receiving the optical signal, the photodiode having an absorption edge that is substantially aligned with a band of wavelengths, wherein the absorption edge shifts toward longer wavelengths when a reverse bias is applied to the photodiode, and control electronics coupled with the photodiode to apply at least a first reverse bias and a second reverse bias to the photodiode, wherein a ratio of a first measurement of the photocurrent at the first reverse bias and a second measurement of the photocurrent at the second reverse bias provides information about the wavelength of the optical signal.

20 Claims, 5 Drawing Sheets

DEVICE AND METHOD FOR MEASURING WAVELENGTH OF AN OPTICAL SIGNAL

TECHNICAL FIELD

Embodiments of the present invention are generally directed to the field of wavelength monitoring in optical networks and, more particularly, to coarse wavelength monitoring of optical signals associated with transmitters, receivers, transceivers, transponders, or tunable lasers, for example.

BACKGROUND

Generally, tunable transceivers or transmitters including tunable lasers are emerging for test and measurement uses, spectral characterization of optical components, fiberoptic networks and other applications. Tunable lasers may allow the reduction of transmitter inventory and may enable dynamic provisioning for optical networks. Currently, telecommunication standards such as set by the International Telecommunications Union (ITU), Telecommunication Standardization Sector of ITU, ITU-T, G.694.1, June 2002, may require optical transmission at particular wavelength ITU channels, prohibiting transmission between channels or uncontrolled switching between channels. Many tunable lasers may be equipped with wavelength lockers to provide "locking" of the wavelength to the nearest channel, where the selection between different channels relies on laser calibration that is typically performed once as a part of the laser manufacturing process. Due to various aging mechanisms, laser calibration may become outdated resulting in a risk of lasing on an unintended channel.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
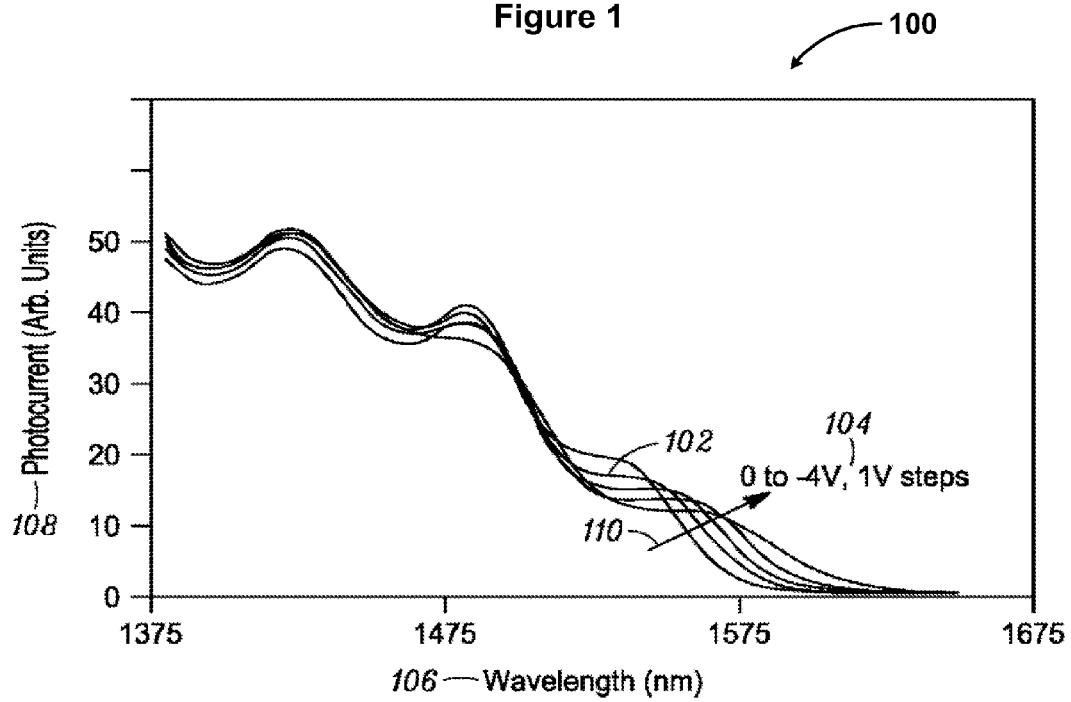
FIG. 1 is a graph of photocurrent spectra for a photodiode measured at different reverse biases, according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of a wavelength meter and an associated method and system are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 is a graph of photocurrent spectra for a photodiode measured at different reverse biases. In an embodiment, a graph 100 includes photocurrent spectra 102 at different reverse biases 104, where the wavelength (nm) 106 of spectra is provided on the x-axis, the photocurrent (arbitrary units) 108 of the spectra is provided on the y-axis, and the absorption edge shift is depicted with arrow 110. In an embodiment, graph 100 depicts a principle of operation used in a coarse wavelength meter or monitor.

A reverse bias 104 applied to a diode structure such, as a photodiode, may cause the absorption edge of the photodiode to shift 110 towards longer wavelengths 106. In an embodiment, a reverse bias 104 applied to a photodiode causes the absorption edge to shift toward wavelengths 106 that are longer than when 0 V is applied. In the depicted embodiment 100, reverse biases between 0 and −4 V are applied in 1 V steps (from left to right) to obtain the photocurrent spectra 102 depicted. In other embodiments, more or less reverse biases 104 at different voltages and/or steps may be applied. In an embodiment, the absorption edge is the transition between the strong short-wavelength and the weak long-wavelength absorption in the spectrum of a solid, such as a semiconductive material.

A photodiode structure may include bulk and quantum-well based semiconductor structures. In a bulk photodiode structure embodiment, the absorption edge shift 110 may be due to electron tunneling through the band gap, also known as the Franz-Keldysh effect. In a quantum-well photodiode structure embodiment, the absorption edge shift 110 may be due to the splitting of quantum energy levels, also known as the quantum-confined Stark effect.

In an embodiment, the absorption edge shifts 110 about 30 nm as the reverse bias 104 increases from 0 to −5 V. In another embodiment, the absorption edge shifts 110 about 20 nm to 100 nm as the reverse bias 104 increases from 0 to −5 V. For a range of wavelengths 106, the ratio of photocurrents 108 measured at two different biases 104 uniquely identifies the wavelength 106, and therefore may be used for coarse wavelength measurement. For example, in an embodiment, photocurrent 108 ratios are calibrated into wavelength 106 units or equivalents as a part of a manufacturing calibration process such that the ratios can be used to determine the wavelength of an optical signal. In another embodiment, the ratio of photocurrents 108 measured at two different biases 104 includes one bias at 0 V. The ratio of photocurrents 108 measured at two different biases 104 may provide information about the magnitude and direction of the shift from a target wavelength 106 of an optical signal. In an embodiment, the provided information has a wavelength 106 resolution of about 0.4 nm, or about 50 GHz, or one standard ITU channel spacing. In an embodiment, the ratio of first and second measurements uniquely identifies a wavelength 106 of an optical signal at a resolution of at least about 0.4 nm to provide coarse wavelength monitoring of the optical signal.

In an embodiment, a wavelength meter includes a photodiode having an absorption edge aligned with a wavelength 106 range of interest and control electronics including biasing circuitry that allows variable reverse biases 104 to be applied to the photodiode. A coarse wavelength meter may allow for wavelength measurements of optical signals associated with transmitters, receivers, transceivers, transponders, or tunable lasers, in an embodiment. A coarse wavelength monitor may be desirable to ensure that a tunable laser does not operate on a wrong channel, for example. In an embodiment, a coarse wavelength meter is used in tunable lasers, tunable transponders, and/or other components of dense wavelength division multiplexing (DWDM) networks for differentiation between optical channels. A coarse wavelength meter may be used with other suitable networks other than DWDM networks. In other embodiments, a coarse wavelength meter may be used in applications on a receiver or detector side. For example, a coarse wavelength meter may detect which wavelength it is receiving and perform an action in response, such as routing the wavelength to a suitable port.

Figure 2:
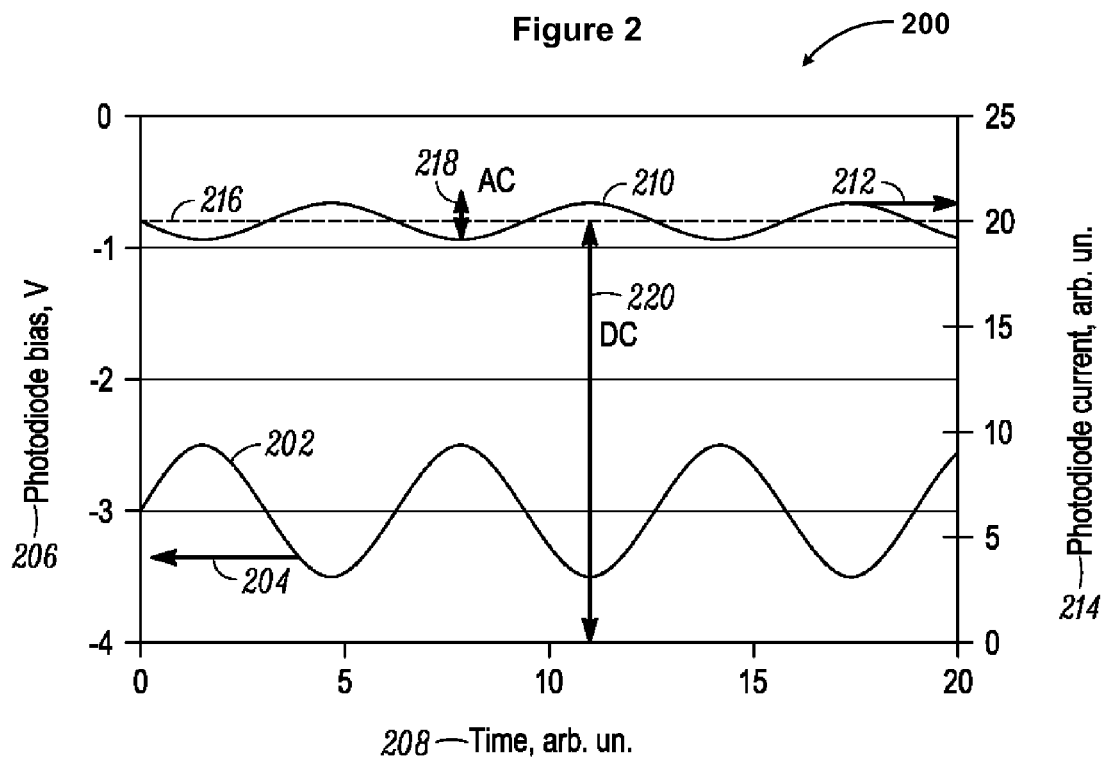
FIG. 2 is a graph depicting an alternating current/direct current (AC/DC) implementation of monitoring an optical signal, according to but one embodiment.

FIG. 2 is a graph depicting an alternating current/direct current (AC/DC) implementation of monitoring an optical signal, according to but one embodiment. In an embodiment, a graph 200 includes a photodiode bias 202 where arrow 204 indicates that the units (V) for photodiode bias are on the left y-axis 206, time (arbitrary units) on the x-axis 208, measured photodiode current or photocurrent 210 where arrow 212 indicates that the units (arbitrary) for photodiode current are on the right y-axis 214, average photocurrent 216, peak-to-trough of AC component 218 of photocurrent, and DC component 220 of photocurrent.

A reverse bias may include direct current (DC), alternating current (AC), or combination AC/DC bias components. In one embodiment, a low frequency sinusoidal modulation is added to a DC reverse bias 202 applied to a photodiode. A low frequency sinusoidal modulation may include an AC signal at about 10 Hz to 100 kHz frequency. In an embodiment, the DC component 220 of the photodiode current 210 is used to measure the power of an optical signal according to any suitable method. The ratio of the AC 218 component to the DC component 220 of the photocurrent may be used to provide information about the wavelength of an optical signal in accordance with embodiments described with respect to FIG. 1 and throughout this specification. For example, the AC/DC 218, 220 ratio of the photocurrent may be calibrated into wavelength units during a manufacturing calibration process (i.e.—using an external wavelength meter, for example). Using an AC/DC ratio as described may enable using a single photodiode to simultaneously function as a power monitor and wavelength meter.

Figure 3:
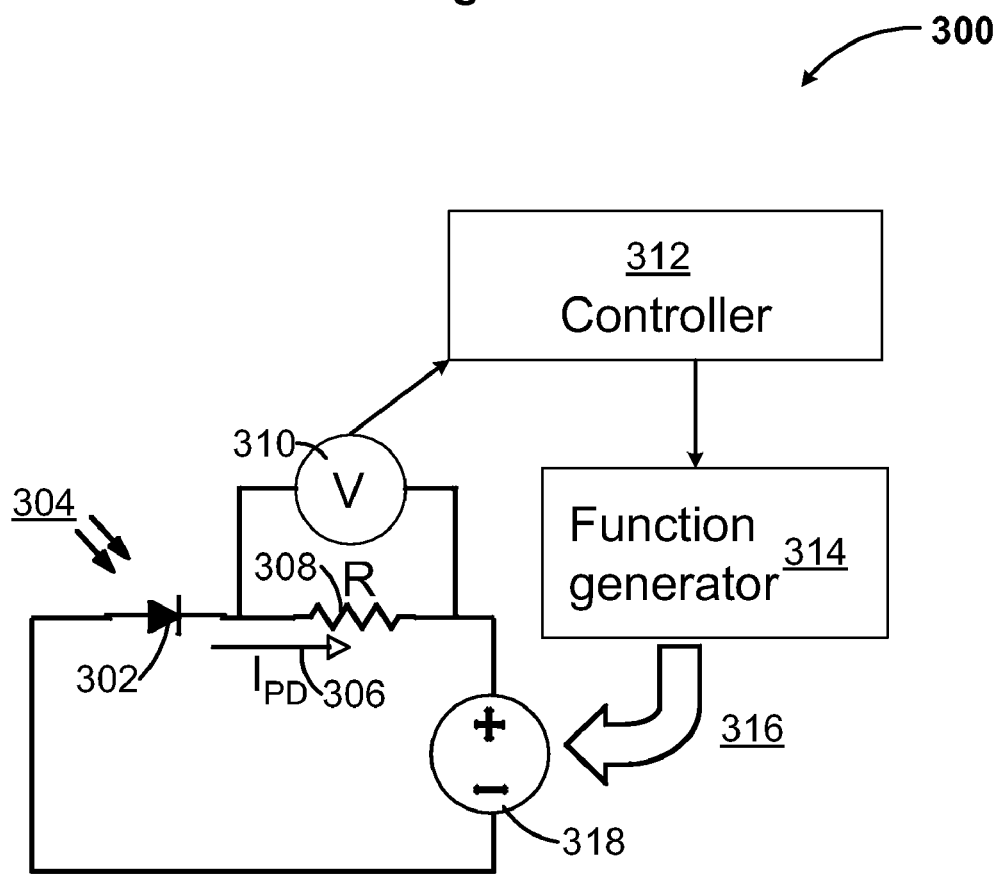
FIG. 3 is a schematic of a wavelength meter, according to but one embodiment.

FIG. 3 is a schematic of a wavelength meter, according to but one embodiment. In an embodiment, an apparatus 300 includes a photodiode 302, optical signal 304, photocurrent $I_{PD}$ 306, resistor 308, voltmeter 310, controller 312, function generator 314, one or more reverse biases 316, and voltage source 318, each coupled as shown.

In an embodiment, an apparatus 300 includes a photodiode 302 to receive an optical signal 304 and to generate a photocurrent 306 upon receiving the optical signal 304, the photodiode 302 having an absorption edge that is substantially aligned with a band of wavelengths, wherein the absorption edge shifts toward longer wavelengths when a reverse bias 316 is applied to the photodiode. In an embodiment, an apparatus 300 includes control electronics 308, 310, 312, 314, 316, 318. In an embodiment, an apparatus 300 further includes biasing circuitry 312, 314, 316, 318 coupled with the photodiode 302 to apply at least a first reverse bias 316 and a second reverse bias 316 to the photodiode 302. In an embodiment, the first or second reverse bias 316 includes either a first or second reverse bias that is 0 V or about 0 V. The first reverse bias may be different than the second reverse bias to enable the extraction of wavelength information using pre-calibrated ratios.

A first measurement of the photocurrent at the first reverse bias and a second measurement of the photocurrent at the second reverse bias may be performed. In an embodiment, measurement circuitry includes voltmeter 310 and resistor 308. The measurements may be performed by voltmeter 310 of the photocurrent 306 across resistor 308. In an embodiment, a ratio of the first measurement and the second measurement provides information about the wavelength of the optical signal 304. The first measurement is different than the second measurement according to an embodiment. The first measurement and second measurement may be measurements of the amplitude of the photocurrent 306 at different applied voltages 316. A ratio of the first and second measurements may be calibrated back to optical frequency to provide information about the frequency or wavelength of an optical signal 304.

Photodiode 302 may have an absorption edge that is substantially aligned with a band of wavelengths. The band of wavelengths include DWDM bands such as S-band wavelengths from about 1492 to 1529 nm, C-band wavelengths from about 1530 to 1569 nm, or L-band wavelengths from about 1570 to 1612 nm, in an embodiment. In practice, band definitions may vary from one system integrator to another. For example, in another embodiment, DWDM bands include S-band wavelengths from about 1490 to 1528 nm, C-band wavelengths from about 1529 to 1568 nm, or L-band wavelengths from about 1569 to 1610 nm. Adjacent bands typically do not overlap for the same system vendor, but may overlap for different vendors. Such variations may be included in the band of wavelengths in accordance with the spirit and scope of this specification. In other embodiments, a band of wavelengths includes any suitable wavelength region, such as 1310 nm, 980, or 850 nm wavelength regions. A coarse wavelength meter may be used in coarse wavelength-division multiplexing (CWDM) applications. For example, CWDM standard ITU-T G.695 may aim to promote vendor interoperability by specifying transmitter/multiplexer characteristics at one end of a CWDM link and the demultiplexer/receiver at the other end. ITU-T G.695 may complement the existing ITU-T G.694.2 recommendation, which defines a wavelength grid with 20 nm channel spacing including 18 wavelengths between 1271 nm and 1611 nm.

In an embodiment, the ratio of the first and second measurements is used to determine whether the wavelength of the optical signal 304 is within the band of wavelengths or within a predetermined wavelength range. If the wavelength is outside of the band of wavelengths or not within a predetermined wavelength range, the wavelength of the optical signal 304 may be tuned or adjusted to be within the desired range of wavelengths. In an embodiment, any suitable method for adjusting or tuning the wavelength of the optical signal 304 is used to correct or adjust the wavelength if it is not within the desired or pre-determined range. In an embodiment, a tunable laser is tuned to adjust the wavelength to be within a predetermined range or band of wavelengths.

In an embodiment, the photodiode 302 includes photodiodes made using bulk semiconductor material, one or more quantum well structures, group III-V semiconductor material, or combinations thereof. Bulk semiconductor materials may include bulk silicon, Ge, SiGe, InP, GaAs, InGaAsP, or any other suitable semiconductor, in an embodiment. Group III-V semiconductor materials may include InP, GaAs, InGaAsP, suitable combinations, and/or any other suitable material for forming photonic integrated circuits.

Photodiode 302 may be a single photodiode 302 in an embodiment. Using a single photodiode 302 to provide information about an optical signal's 304 wavelength precludes the need for using two separate photodetectors with different bandgaps to evaluate wavelength. A one-diode solution may be cheaper, improve yields, and may require only two pins to monitor.

In an embodiment, measurement circuitry includes a resistor 308 coupled with a photodiode 302 where the photocurrent 306 is allowed to pass across the resistor 308, a voltmeter 310 coupled with the resistor 308, the voltmeter 310 being used to perform a first and second measurement by measuring the voltage created by the photocurrent 306 across the resistor 308 at respective first and second reverse biases 316. Biasing circuitry may include a controller 312 coupled with the voltmeter 310, the controller 312 to receive the first and second measurements wherein the controller 312 is calibrated to convert the ratio of the first and second measurements to wavelength units, and a function generator 314 coupled with the controller 312 and the photodiode 302 to apply at least the first and second reverse biases 316. In an embodiment, the biasing circuitry is capable of applying DC, AC, or combination AC/DC biases between about 0 and −6 V, for example, where the photocurrent includes current between about 1 µA and 10 mA, for example. The biases and photocurrent are not limited to these values and may include other suitable values in various applications.

In an embodiment, a controller 312 requests the function generator 314 to output voltage waveform with an AC, DC, or combined AC/DC bias. Light 304 in a tunable laser waveguide may generate photocurrent 306 in photodiode 302. The photocurrent 306 may generate a voltage across resistor 308, the voltage being sensed by the voltmeter 310. The voltmeter 310 may report time-dependent voltage to the controller 312, the controller 312 being calibrated prior to measurement with a look-up table, for example, to translate photocurrent ratio to wavelength or optical frequency. In other embodiments, an arbitrary fitting function is used to translate ratio to wavelength units.

An apparatus 300 may apply more than two biases to achieve finer resolution, for example. In an embodiment, an apparatus 300 includes control electronics that include biasing circuitry that is capable of applying a third or more reverses biases to the photodiode where a third or more measurements of the photocurrent are made at the respective third or more reverse biases. In an embodiment, the ratios between a first, second, and/or third or more photocurrents are calibrated into wavelength units to indicate whether the optical signal is operating within the band of wavelengths.

Figure 4:
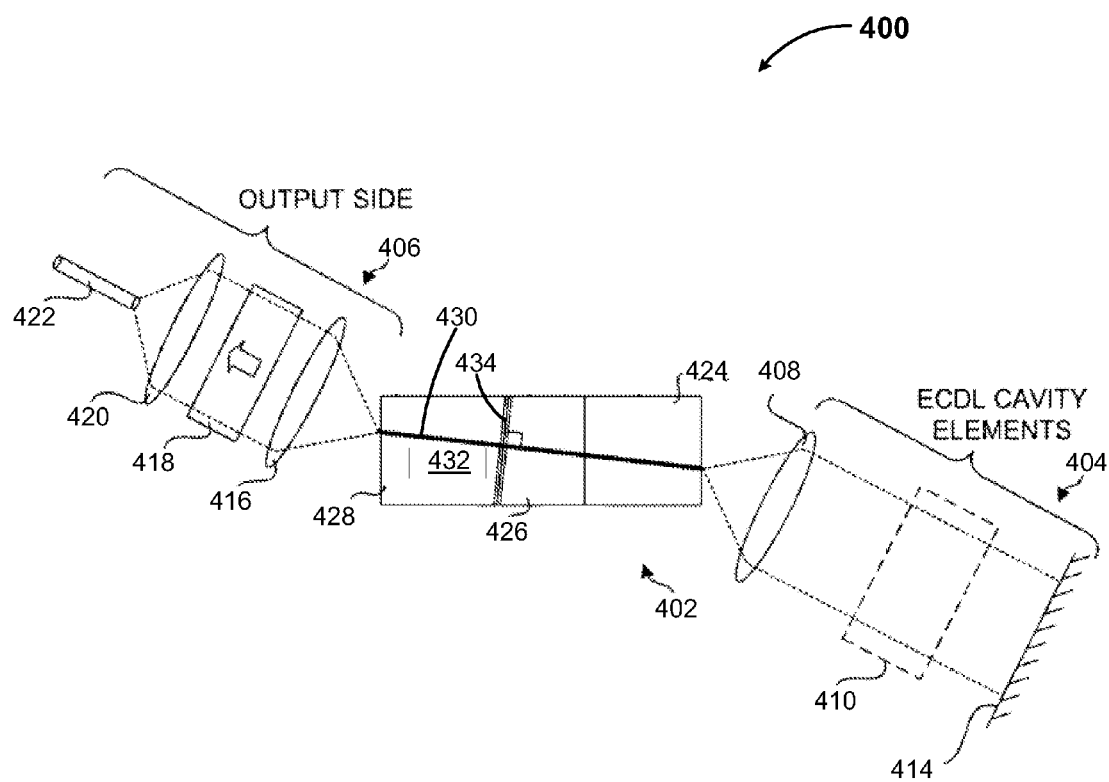
FIG. 4 is a schematic of a wavelength meter coupled with a tunable laser, according to but one embodiment.

FIG. 4 is a schematic of a wavelength meter coupled with a tunable laser, according to but one embodiment. In an embodiment, an apparatus 400 includes an integrated structure 402 optically coupled between a set of external cavity elements 404 and a set of output side elements 406. Cavity elements 404 may include a collimating lens 408, a tuning filter element or elements 410, and a reflective element 414. Output side elements 406 may include a collimating lens 416, an optical isolator 418, a fiber focusing lens 420, and an output fiber 422. Integrated structure 402 may include a gain section 424, a phase control section 426, and a modulator section 428, which may be optically coupled via waveguide 430. A wavelength meter or wave meter 432 in accordance with embodiments described herein may be optically coupled to the waveguide 430. Although an ECDL embodiment is depicted here, the term tunable lasers is not limited to the ECDL variety, but may include semi-integrated external cavity diode lasers, monolithically integrated devices, or any type or form of tunable laser.

In an embodiment, a wave meter 432 is optically coupled to a waveguide 430 in the modulator section 428 of integrated structure 402. In another embodiment, a photodiode 432 of a wave meter is optically coupled to a waveguide 430 to receive a portion of light or an optical signal in the waveguide 430. In yet another embodiment, the waveguide 430 is split into two branches and a photodiode 432 is optically coupled to a side (not a through) branch of waveguide 430. A mirror 434 may be disposed between phase control section 426 and modulator section 428. A wave meter 432 may be used in accordance with analogous embodiments of tunable lasers other than what is depicted in apparatus 400. For example, in an embodiment, tilted waveguide geometries such as depicted in integrated structure 402 are used. In other embodiments, bent waveguide geometries are used.

Figure 5:
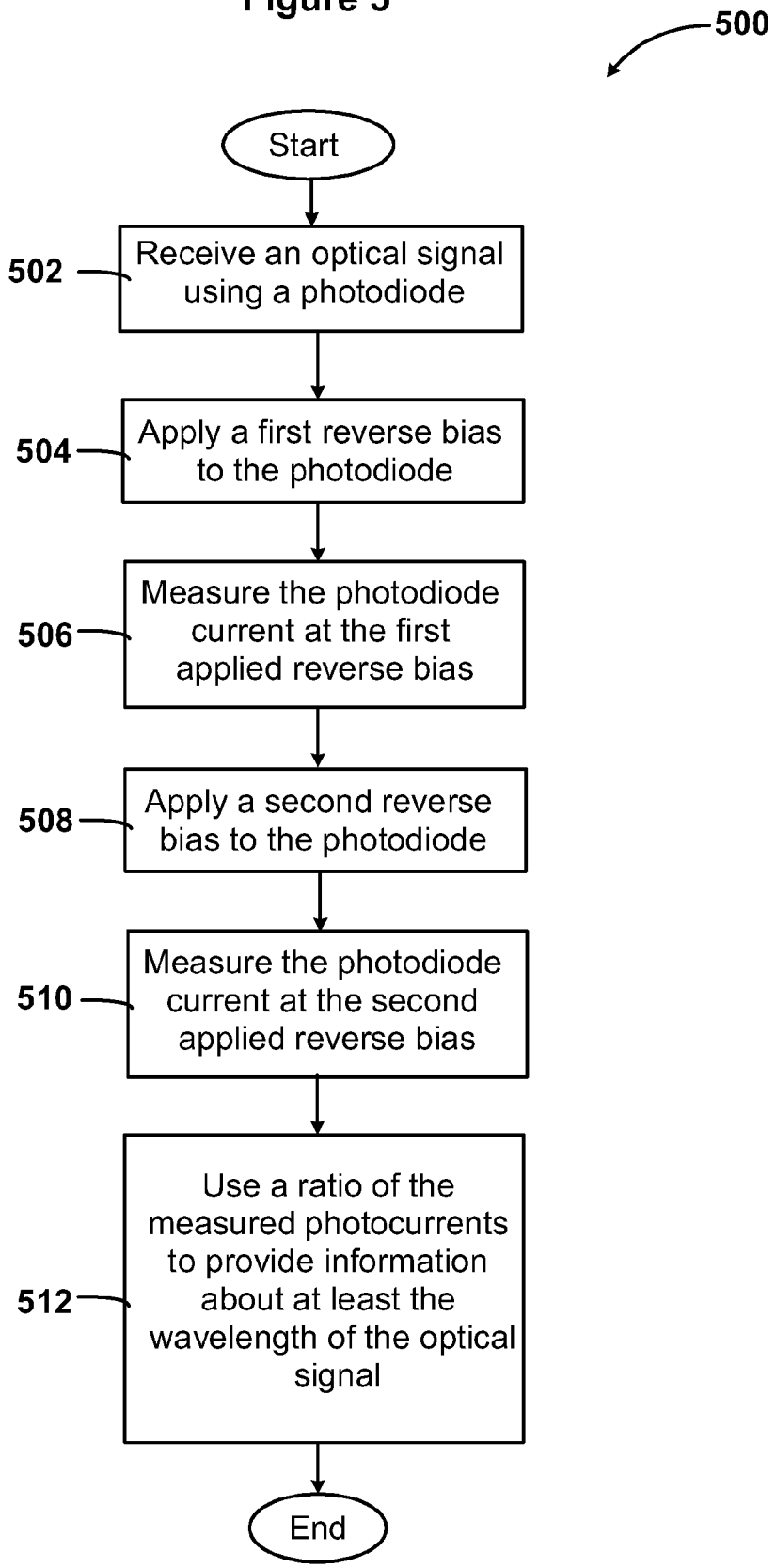
FIG. 5 is a flow diagram of a method for monitoring the wavelength of an optical signal, according to but one embodiment.

FIG. 5 is a flow diagram of a method for monitoring the wavelength of an optical signal, according to but one embodiment. In an embodiment, a method 500 includes receiving an optical signal using a photodiode at box 502, applying a first reverse bias to the photodiode at box 504, measuring the photodiode current at the first applied reverse bias at box 506, applying a second reverse bias to the photodiode at box 508, measuring the photodiode current at the second applied reverse bias at box 510, and using a ratio of the measured photocurrents to provide information about at least the wavelength of the optical signal at box 512, with arrows providing but one suggested flow.

In an embodiment, a method 500 includes receiving an optical signal using a photodiode 502 having an absorption edge substantially aligned with a band of wavelengths, generating a photocurrent using the photodiode upon receiving the optical signal, applying a first reverse bias to the photodiode 504, performing a first measurement of the photocurrent at the first reverse bias 506, applying a second reverse bias to the photodiode 508, performing a second measurement of the photocurrent at the second reverse bias 510 wherein a ratio of the first and second measurements provides information about the wavelength of the optical signal. In an embodiment, applying a first reverse or second bias includes applying a bias of 0 V or about 0 V.

In an embodiment, applying a first bias 504 or applying a second bias 508 shifts the absorption edge of the photodiode toward longer wavelengths. In another embodiment, the band of wavelengths includes dense wavelength division multiplexing (DWDM) bands, the DWDM bands comprising S-band wavelengths from about 1492 to 1529 nm, C-band wavelengths from about 1530 to 1569 nm, or L-band wavelengths from about 1570 to 1612 nm.

A ratio of the first and second measurements may uniquely identify a wavelength of an optical signal 512. In an embodiment, a ratio of the first and second measurements uniquely identifies a wavelength of the optical signal 512 at a resolution of at least about 0.4 nm to provide coarse wavelength monitoring of the optical signal.

In an embodiment, the ratio of the first and second measurements is used to determine whether the wavelength of the optical signal is within the band of wavelengths or within a predetermined wavelength range 512. If the wavelength is outside of the band of wavelengths or not within a predetermined wavelength range, the wavelength of the optical signal may be tuned or adjusted to be within the desired range of wavelengths. In an embodiment, any suitable method for adjusting or tuning the wavelength of the optical signal is used to correct or adjust the wavelength if it is not within the desired or pre-determined range. In an embodiment, a tunable laser is tuned to adjust the wavelength to be within a predetermined range or band of wavelengths.

Applying a first bias 504 or applying a second bias 508 includes applying DC, AC, or combination AC/DC first and second reverse biases, in an embodiment. In an embodiment, applying a first 504 or second bias 508 is accomplished by applying a sinusoidal modulation. In an embodiment, performing a first measurement 506 or second measurement 510 includes measuring the difference between the high and low peak of a sinusoidal photocurrent to provide a first or second measurement 506, 510. In an embodiment, applying the first and/or second reverse biases 504, 508 includes applying a voltage between about 0 and −6 V. In another embodiment, the measured photocurrent includes currents between about 1 µA and 10 mA.

In an embodiment, applying a first or second reverse bias 504, 508 includes applying a DC reverse bias component and applying a low frequency AC bias component at frequencies of about 10 Hz to 100 kHz. According to this embodiment, performing the respective first or second measurement 506, 510 includes measuring the DC component of the photocurrent to determine the power of the optical signal and measuring the AC component of the photocurrent such that the ratio of the measured AC component to the measured DC component provides information to determine the wavelength of the optical signal. For example, the information may be a ratio of photocurrent measurements that is calibrated in a wave meter to convert the ratio into wavelength units.

A method 500 may further include performing more than two measurements in other embodiments. In an embodiment, a method 500 further includes applying a third or more reverse biases to a photodiode and performing a third or more measurements of the photocurrent at the respective third or more reverse biases, wherein the ratios between the first, second, and/or third or more measurements are calibrated into wavelength units to indicate whether the optical signal is operating within the band of wavelengths.

In other embodiments, a method 500 accords with embodiments already described with respect to other figures in this specification. Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 6:
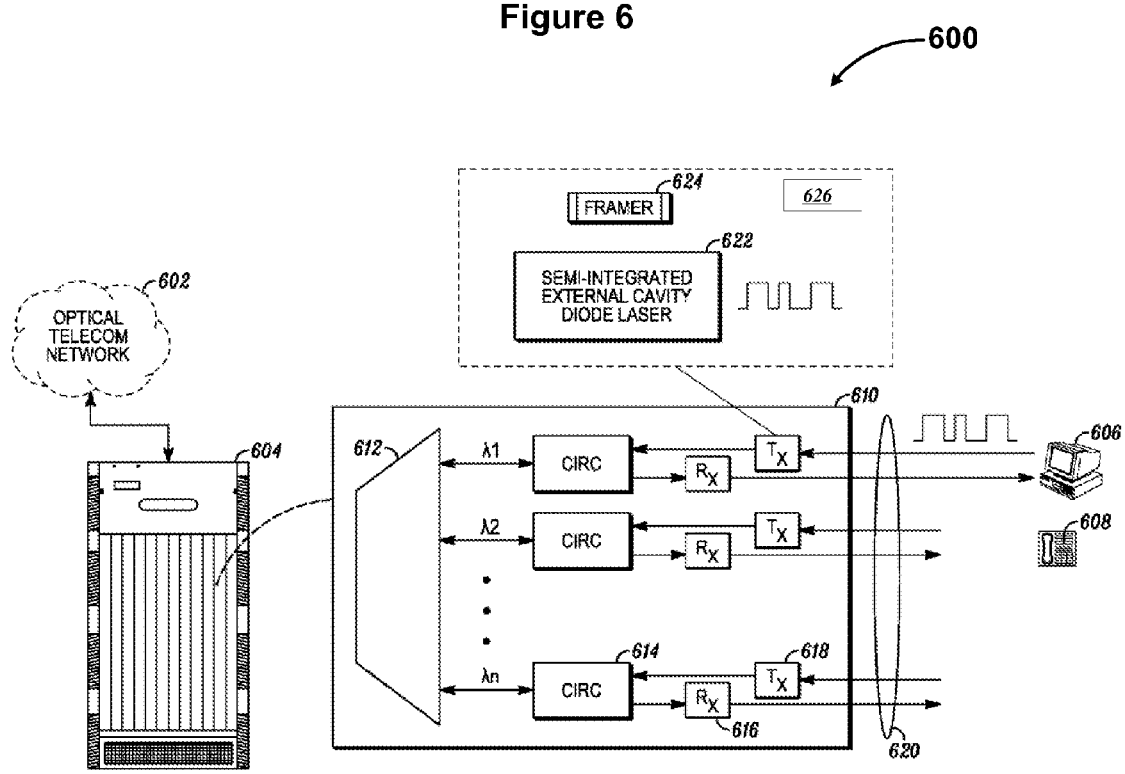
FIG. 6 is a schematic of an example system in which embodiments of the present invention may be used, according to but one embodiment.

FIG. 6 is a schematic of an example system in which embodiments of the present invention may be used, according to but one embodiment. In an embodiment, a communication system 600 includes an optical network 602 coupled to a plurality of data 606 and/or voice 608 subscriber lines by an optical multi-state multiplexer/demultiplexer (mux/demux) 612 utilizing tunable lasers 622 coupled with one or more wave meters 626 that accord with embodiments described herein. One or more tunable lasers 622 are not limited to the ECDL variety, but may include semi-integrated external cavity diode lasers, monolithically integrated devices, or any type or form of tunable laser.

A communication system 600 may include an optical network 602, a network switch 604, a data terminal 606, and/or a voice terminal 608, each coupled as shown. Modulated data may be carried on a number of channels in multiple access protocols including but not limited to: wavelength division multiplexing (WDM), dense wavelength division multiplexing (DWDM), frequency division multiple access (FDMA), etc. The center frequencies of each channel may be specified by standard setting organizations such as the International Telecommunications Union (ITU). Telecommunication standards such as set by the ITU, Telecommunication Standardization Sector of ITU, ITU-T, G.694.1, June 2002, may require optical transmission at particular wavelength ITU channels, prohibiting transmission between channels or uncontrolled switching between channels. A wave meter 626 using a single photodiode as described herein may indicate whether a laser or optical signal is operating on the desired channel.

A network switch 604 provides network-switching operations, which may be facilitated by optical transceivers that are mounted on fiber line cards 610. A fiber line card 610 may include a mux/demux 612, a circulator bank including circulators 614, a receiver bank including receivers 616, and a transmitter bank including transmitters 618. The mux/demux 612 may be a passive optical device that divides wavelengths or channels from a multi-channel optical signal, or combines various wavelengths or channels on respective optical paths into one multi-channel optical signal depending on the propagation direction of the light.

In the receive mode, after de-multiplexing, each individual channel is passed via a corresponding circulator 614 within the circulator band to a corresponding receiver 616 in the receiver bank. Each receiver 616 may include a narrow bandpass photodetector, framer, and decoders (not shown). Switches (not shown) may couple the receiver over a corresponding one of subscriber lines 620 to a data or voice terminal 606 or 608.

In the transmit mode, each line card transmitter bank includes a bank of lasers 622, including n lasers radiating light at one of the selected center frequencies of each channel of the telecommunications wavelength grid. Current wavelength ranges of ITU-defined grids are split between three bands: S-band wavelengths from 1492 to 1529 nm, C-band wavelengths from 1530 to 1569 nm, and L-band wavelengths from 1570 to 1612 nm. A subscriber datastream may be optically modulated onto the output beam of a corresponding laser that is optically coupled with a wave meter 626 to determine whether the laser is lasing at a desired frequency or wavelength.

A framer 624 allows framing, pointer generation, and scrambling for transmission of data from the bank of lasers 622 and associated drivers. The modulated information from each of the lasers is passed via a corresponding circulator into mux/demux 612, which couples the output to a single optical fiber for transmission. A fiber line card 610 may be duplex, allowing bi-directional communications.

In an embodiment, a system 600 includes a photodiode 626 to receive an optical signal and to generate a photocurrent upon receiving the optical signal, the photodiode having an absorption edge that is substantially aligned with a band of wavelengths, wherein the absorption edge shifts toward longer wavelengths when a reverse bias is applied to the photodiode. A system may further include control electronics that include biasing circuitry coupled with the photodiode 626 to apply at least a first reverse bias and a second reverse bias to the photodiode 626, wherein a ratio of a first measurement of the photocurrent at the first reverse bias and a second measurement of the photocurrent at the second reverse bias provides information about the wavelength of the optical signal, and a tunable transmitter 618 coupled with the photodiode 626 to provide the optical signal. The tunable transmitter 618 includes a tunable laser 622 wherein the tunable laser includes a waveguide that is optically coupled with the photodiode 626, according to an embodiment.

In an embodiment, the photodiode 626 and the tunable laser 622 are part of a photonic integrated circuit. The photodiode may include bulk semiconductor material, one or more quantum well structures, group III-V semiconductor material, or combinations thereof. In an embodiment, the photodiode includes InP, GaAs, InGaAsP, or combinations thereof. In another embodiment, the photodiode and the tunable transmitter are separate semiconductor devices (i.e.—not fully integrated).

A system 600 may further include a network switch 604 coupled with the tunable transmitter 618, a voice or data terminal coupled with the tunable transmitter, and an optical network coupled with the network switch. In the case where a tunable transmitter is part of a network switch, the term network switch refers to all other components associated with a network switch except the tunable transmitter. Other analogous scenarios may also comport with this meaning.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined entirely by the following claims, which are to be construed in accordance with established doctrines of claim interpretation.

What is claimed is:

1. An apparatus, comprising:
   a photodiode to receive an optical signal and to generate a photocurrent upon receiving the optical signal, the photodiode having an absorption edge that is substantially aligned with a band of wavelengths, the alignment of the absorption edge varying within the band of wavelengths when a reverse bias that is applied to the photodiode is varied; and
   control electronics coupled with the photodiode to apply at least a first reverse bias and a second reverse bias to the photodiode, a ratio of a first magnitude of the photocurrent at the first reverse bias and a second magnitude of the photocurrent at the second reverse bias corresponding to wavelength information of the optical signal with respect to the band of wavelengths.

2. An apparatus according to claim 1, wherein the band of wavelengths comprises dense wavelength division multiplexing (DWDM) bands, the DWDM bands comprising S-band wavelengths from about 1492 to 1529 nm, C-band wavelengths from about 1530 to 1569 nm, or L-band wavelengths from about 1570 to 1612 nm.

3. An apparatus according to claim 1, wherein the photodiode comprises bulk semiconductor material, one or more quantum well structures, group III-V semiconductor material, or combinations thereof.

4. An apparatus according to claim 1, wherein the control electronics comprises:
   a resistor coupled with the photodiode, wherein the photocurrent is allowed to pass across the resistor;
   a voltmeter coupled with the resistor, the voltmeter to measure the first and second magnitudes of the photocurrent by measuring a voltage across the resistor at the respective first and second reverse biases;
   a controller coupled with the voltmeter, the controller to receive the first and second magnitudes, wherein the controller is calibrated to convert the ratio of the first and second magnitudes to correspond to a wavelength unit; and
   a function generator coupled with the photodiode to apply at least the first and second reverse biases.

5. An apparatus according to claim 1, wherein the ratio of the first and second magnitudes corresponds to a predetermined wavelength of the optical signal at a resolution of at least about 0.4 nm.

6. An apparatus according to claim 1, wherein the control electronics are capable of applying a third or more reverse biases to the photodiode, wherein a third or more measurements of a magnitude of the photocurrent are made at the respective third or more reverse biases, and wherein ratios between the first, second, and third or more magnitudes of the photocurrents are calibrated to correspond to selected predetermined wavelengths within the band of wavelengths.

7. An apparatus according to claim 1, wherein the control electronics are capable of applying direct current (DC), alternating current (AC), or combination AC/DC first and second reverse biases comprising voltages between about 0 and −6 V, and the photocurrent comprising currents between about 1 μA and 10 mA.

8. A method, comprising:
   receiving an optical signal using a photodiode having an absorption edge substantially aligned with a band of wavelengths;
   generating a photocurrent using the photodiode upon receiving the optical signal;
   applying a first reverse bias to the photodiode;
   measuring a first magnitude of the photocurrent at the first reverse bias;
   applying a second reverse bias to the photodiode;
   measuring a second magnitude of the photocurrent at the second reverse bias, wherein a ratio of the first and second magnitudes corresponds to wavelength information of the optical signal with respect to the band of wavelengths.

9. A method according to claim 8, wherein applying a first reverse bias or applying a second reverse bias shifts the absorption edge of the photodiode toward longer wavelengths, and wherein the band of wavelengths comprises dense wavelength division multiplexing (DWDM) bands, the DWDM bands comprising S-band wavelengths from about 1492 to 1529 nm, C-band wavelengths from about 1530 to 1569 nm, or L-band wavelengths from about 1570 to 1612 nm.

10. A method according to claim 8, further comprising:
    applying a third or more reverse biases to the photodiode;
    performing a third or more measurements of a magnitude of the photocurrent at the respective third or more reverse biases, wherein the ratios between the first, second, and third or more magnitudes are calibrated to correspond to selected predetermined wavelengths within the band of wavelengths.

11. A method according to claim 8, wherein the ratio of the first and second magnitudes corresponds to a predetermined wavelength of the optical signal at a resolution of at least about 0.4 nm, the method further comprising:
   determining whether the predetermined wavelength of the optical signal is within the band of wavelengths using the ratio of the first and second magnitudes; and
   tuning the wavelength of the optical signal to be within the band of wavelengths if the wavelength of the optical signal is determined not to be within the band of wavelengths.

12. A method according to claim 8, wherein applying the first reverse bias and applying the second reverse bias comprises applying direct current (DC), alternating current (AC), or combination AC/DC first and second reverse biases, wherein the first and second reverse biases comprise voltages between about 0 and −6 V, and wherein the photocurrent comprises currents between about 1 µA and 10 mA.

13. A method according to claim 8, wherein applying the first or the second reverse bias comprises applying a direct current (DC) reverse bias component and applying a low frequency alternating current (AC) bias component at about 10 Hz to 100 kHz, wherein measuring the respective first or second magnitudes of the photocurrent comprises measuring the DC component of the photocurrent to determine the power of the optical signal and measuring the AC component of the photocurrent, wherein a ratio of the measured AC component to the measured DC component provides information to determine the wavelength of the optical signal.

14. A system, comprising:
   a photodiode to receive an optical signal and to generate a photocurrent upon receiving the optical signal, the photodiode having an absorption edge that is substantially aligned with a band of wavelengths, the alignment of the absorption edge varying within the band of wavelengths when a reverse bias that is applied to the photodiode is varied;
   control electronics coupled with the photodiode to apply at least a first reverse bias and a second reverse bias to the photodiode, a ratio of a first magnitude of the photocurrent at the first reverse bias and a second magnitude of the photocurrent at the second reverse bias corresponding to wavelength information of the optical signal with respect to the band of wavelengths; and
   a tunable transmitter coupled with the photodiode to provide the optical signal.

15. A system according to claim 14, wherein the tunable transmitter comprises a tunable laser, and wherein the optical signal comprising a waveguide optically coupled with the photodiode.

16. A system according to claim 14, wherein the control electronics comprise:
   a resistor coupled with the photodiode, wherein the photocurrent is allowed to pass across the resistor;
   a voltmeter coupled with the resistor, the voltmeter to measure the first and second magnitudes of the photocurrent by measuring a voltage across the resistor at the respective first and second reverse biases;
   a controller coupled with the voltmeter, the controller to receive the first and second magnitudes, wherein the controller is calibrated to convert the ratio of the first and second magnitudes to correspond to a wavelength unit; and
   a function generator coupled with the photodiode to apply at least the first and second reverse biases.

17. A system according to claim 14, wherein the photodiode and the tunable transmitter are part of a photonic integrated circuit.

18. A system according to claim 17, wherein the photodiode comprises bulk semiconductor material, one or more quantum well structures, group III-V semiconductor material, or combinations thereof.

19. A system according to claim 14, wherein the photodiode and the tunable transmitter are separate semiconductor devices.

20. A system according to claim 14, further comprising:
   a voice or data terminal coupled with the tunable transmitter; and
   a network switch coupled with the tunable transmitter, wherein the network switch is capable of providing network-switching operations over an optical network via the tunable transmitter.

* * * * *